US009384370B1

(12) United States Patent
Choi

(10) Patent No.: US 9,384,370 B1
(45) Date of Patent: Jul. 5, 2016

(54) SIGNAL COMBINATION CIRCUIT AND DIGITAL TO ANALOG CONVERSION CIRCUIT USING THE SAME

(71) Applicant: SK hynix Inc., Icheon-si Gyeonggi-do (KR)

(72) Inventor: Young Jae Choi, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/729,721

(22) Filed: Jun. 3, 2015

(30) Foreign Application Priority Data

Feb. 27, 2015 (KR) .................. 10-2015-0028586

(51) Int. Cl.
*H03M 1/66* (2006.01)
*G06G 7/14* (2006.01)
*H03M 1/06* (2006.01)

(52) U.S. Cl.
CPC ............ *G06G 7/14* (2013.01); *H03M 1/067* (2013.01); *H03M 1/0665* (2013.01); *H03M 1/0673* (2013.01); *H03M 1/662* (2013.01)

(58) Field of Classification Search
CPC . H03M 1/0665; H03M 1/067; H03M 1/0668; H03M 1/0673; H03M 1/662; G06G 7/14
USPC .................................. 341/118, 141, 143–145
See application file for complete search history.

(56) References Cited

U.S. PATENT DOCUMENTS 6,570,521 B1 * 5/2003 Schofield ............ H03M 1/0673
341/143

6,614,377 B1 * 9/2003 Adams ................ H03M 1/0665
341/144
6,819,276 B1 * 11/2004 Hossack ............. H03M 1/0673
341/143
6,897,797 B2 * 5/2005 Zhao ................... H03M 1/0668
341/144

(Continued)

FOREIGN PATENT DOCUMENTS

KR          100911427 B1      8/2009
KR       1020130035927 A      4/2013

OTHER PUBLICATIONS

Takahiro Miki, An 80-MHz 8-bit CMOS D/A Converter, IEEE Journal of Solid-State Circuits, Dec. 1986, pp. 983-988, vol. SC-21, No. 6.

(Continued)

*Primary Examiner* — Khai M Nguyen
(74) *Attorney, Agent, or Firm* — William Park & Associates Ltd.

(57) ABSTRACT

A signal combination circuit includes a first decoding block configured to decode a first signal group of an input signal and generate a first decoding signal group according to a first random number signal, a second decoding block configured to decode a second signal group of the input signal and generate a second decoding signal group according to the first random number signal, a first network block configured to randomly mix the first decoding signal group and generate a first preliminary mixed signal group according to a second random number signal, a second network block configured to randomly mix the second decoding signal group and generate a second preliminary mixed signal group according to the second random number signal, and a selection block configured to selectively combine the first preliminary mixed signal group and the second preliminary mixed signal group and generate a mixed signal group according to the first random number signal.

20 Claims, 11 Drawing Sheets

(56) References Cited

U.S. PATENT DOCUMENTS

| | | | |
|---|---|---|---|
| 7,679,539 B2 * | 3/2010 | Lee | H03M 1/0673 341/120 |
| 7,868,806 B2 * | 1/2011 | Seo | H03M 1/004 341/118 |
| 8,159,381 B2 * | 4/2012 | Parida | H03M 7/12 341/118 |
| 8,803,718 B2 * | 8/2014 | Parida | H03M 7/12 341/118 |
| 8,903,092 B2 * | 12/2014 | Ostrem | 341/110 |

OTHER PUBLICATIONS

Rex T. Baird et al., Linearity Enhancement of Multibit A/D and D/A Converters Using Data Weighted Averaging, Dec. 1995, pp. 753-762, vol. 42, No. 12.

* cited by examiner

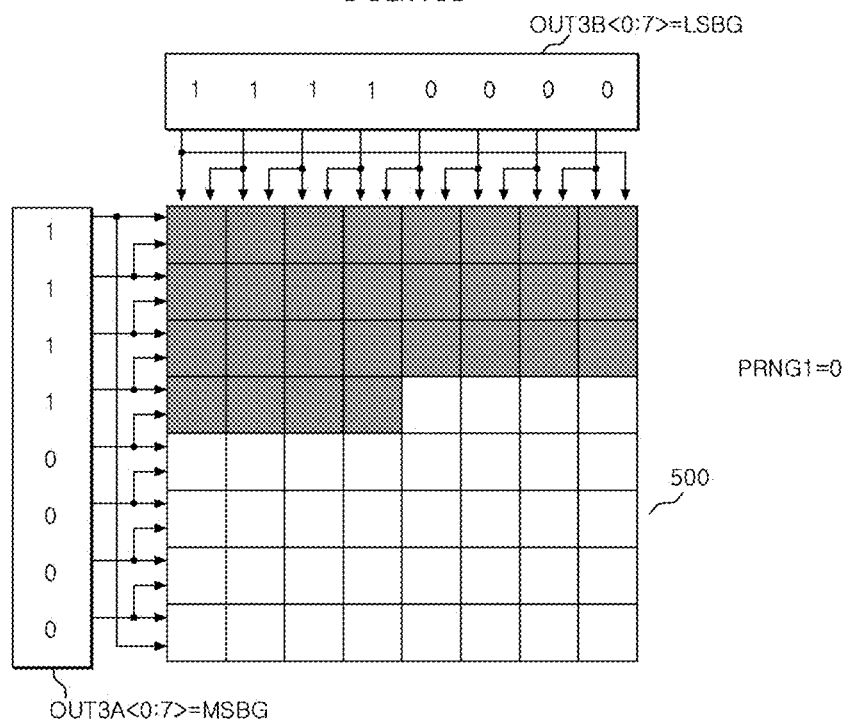
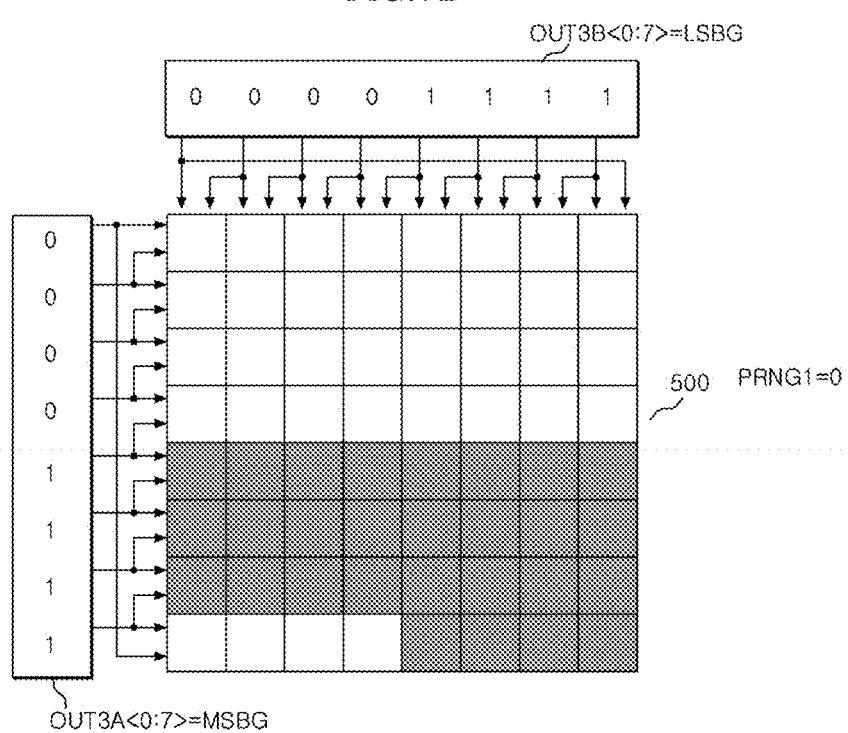

SIGNAL COMBINATION CIRCUIT AND DIGITAL TO ANALOG CONVERSION CIRCUIT USING THE SAME

CROSS-REFERENCES TO RELATED APPLICATION

This application claims priority under 35 U.S.C. 119(a) to Korean application No. 10-2015-0028586, filed on Feb. 27, 2015, in the Korean intellectual property Office, which is incorporated by reference in its entirety as set forth in full.

BACKGROUND

1. Technical Field

The inventive concept relates to a semiconductor circuit, and more particularly, to a signal combination circuit and a digital to analog conversion (DAC) circuit using the same.

2. Related Art

DAC circuits are circuits which convert a digital signal to an analog signal, and have been used in various semiconductor circuits or the like including semiconductor memories.

For stable and reliable operations in the DAC circuits, linearity of an out signal has to be guaranteed.

SUMMARY

According to an embodiment, there is provided a signal combination circuit. The signal combination circuit may include a first decoding block configured to decode a first signal group of an input signal and generate a first decoding signal group according to a first random number signal. The signal combination circuit may also include a second decoding block configured to decode a second signal group of the input signal and generate a second decoding signal group according to the first random number signal. The signal combination circuit may also include a first network block configured to randomly mix the first decoding signal group and generate a first preliminary mixed signal group according to a second random number signal. The signal combination circuit may also include a second network block configured to randomly mix the second decoding signal group and generate a second preliminary mixed signal group according to the second random number signal. Further, the signal combination circuit may also include a selection block configured to selectively combine the first preliminary mixed signal group and the second preliminary mixed signal group and generate a mixed signal group according to the first random number signal.

According to an embodiment, there is provided a digital to analog conversion (DAC) circuit. The DAC circuit may include a signal combination circuit configured to decode and randomly mix an input signal and generate preliminary mixed signal groups through separated signal processing paths, and to selectively combine the preliminary mixed signal groups and generate a mixed signal group according to one or more random number signals. The DAC circuit may also include a DAC unit array configured to convert the mixed signal group to a plurality of analog signals. Further, the DAC circuit may also include an addition unit configured to add the plurality of analog signals and output an addition result.

According to an embodiment, there is provided a signal combination circuit. The signal combination circuit may include a bit exchange unit configured to divide signal bits of an input signal into a plurality of signal groups, and control ranks of the signal bits of the plurality of signal groups to have original values or changed values according to a first random number signal. The signal combination circuit may also include a plurality of decoding blocks configured to decode the plurality of signal groups and generate a plurality of decoding signal groups according to the first random number signal. The signal combination circuit may also include a plurality of network blocks configured to randomly mix the plurality of decoding signal groups and generate a plurality of preliminary mixed signal groups according to a second random number signal. Further, the signal combination circuit may also include a selection block configured to selectively combine the plurality of preliminary mixed signal groups and generate a mixed signal group according to the first random number signal.

DETAILED DESCRIPTION

Figure 1:
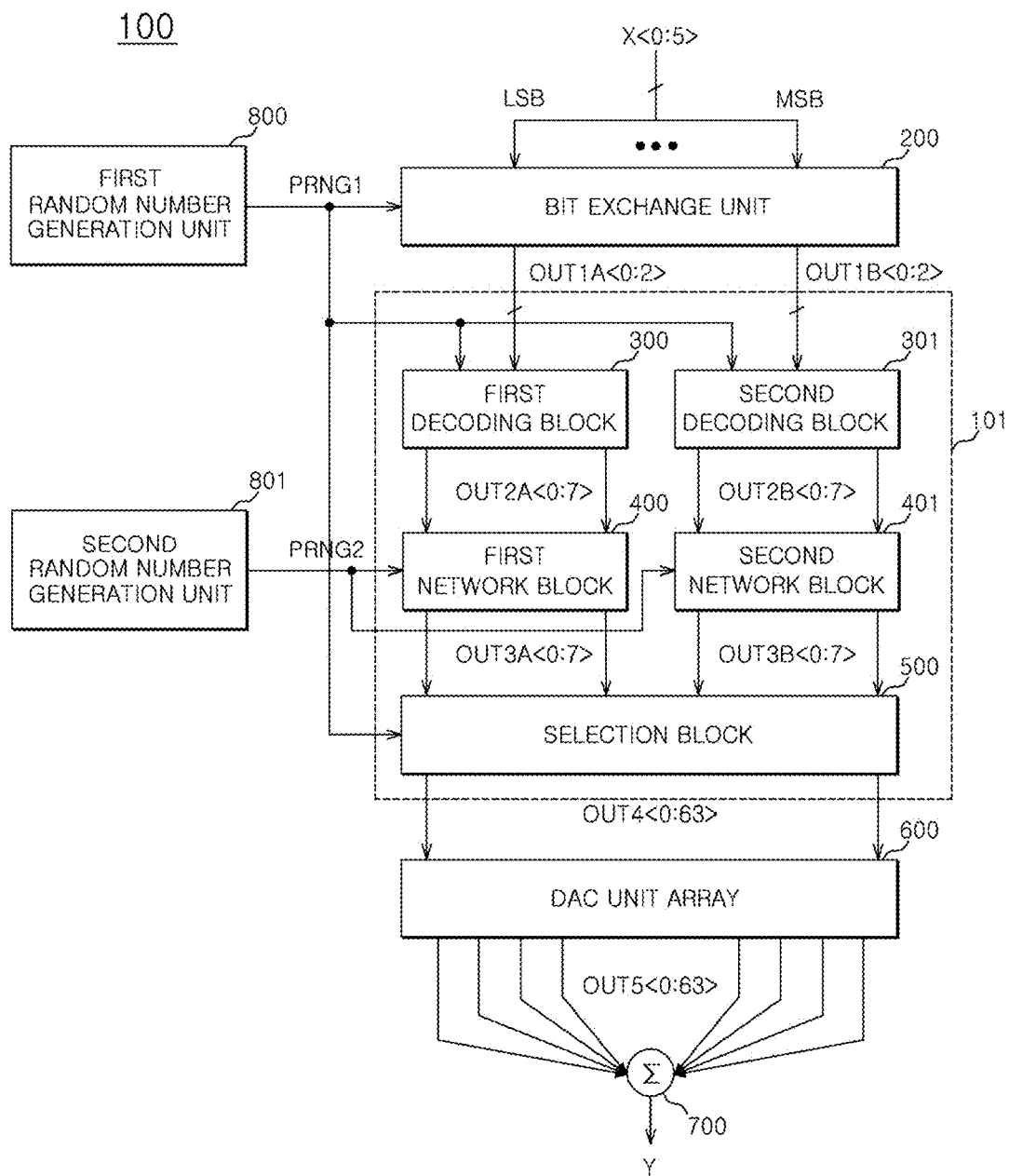
FIG. 1 is a view illustrating a configuration of a DAC unit according to an embodiment of the inventive concept.

Hereinafter, embodiments will be described in greater detail with reference to the accompanying figures. Various embodiments are described herein with reference to cross-sectional illustrations that are schematic illustrations of various embodiments (and intermediate structures). As such, variations from the shapes of the illustrations as a result, for example, of manufacturing techniques and/or tolerances, are to be expected. Thus, various embodiments should not be construed as limited to the particular shapes of regions illustrated herein but may be to include deviations in shapes that result, for example, from manufacturing. In the figures, lengths and sizes of layers and regions may be exaggerated for clarity. Like reference numerals in the figures denote like elements. It is also understood that when a layer is referred to as being "on" another layer or substrate, it can be directly on the other or substrate, or intervening layers may also be present. One or more embodiments are provided to a signal combination circuit of which hardware complexity is reduced and a DAC circuit using the same.

The inventive concept is described herein with reference to cross-section and/or plan illustrations that are schematic illustrations of idealized embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these embodiments without departing from the principles and spirit of the inventive concept.

A DAC circuit is a circuit which converts a digital signal to an analog signal. The DAC circuit may use various signal processing methods to guarantee static linearity of an output signal.

A dynamic element matching (DEM) method may be used as one of the various signal processing methods.

An embodiment of the inventive concept may configure a signal combination circuit using a DEM method, which has a divided structure which divides an input signal in certain units and processes divided signal groups, and apply the signal combination circuit to a DAC circuit.

Referring to FIG. 1, a DAC circuit 100 according to an embodiment of the inventive concept may include a signal combination circuit 101, a DAC unit array 600, and an addition unit 700.

The signal combination unit 101 may be configured to decode and randomly mix an input signal X<0:5> and generate preliminary mixed signal groups OUT3A<0:7> and OUT3B<0:7> through separated signal processing paths. The signal combination unit 101 may also be configured to selectively combine the preliminary mixed signal groups OUT3A<0:7> and OUT3B<0:7> and generate a mixed signal group OUT4<0:63>, in response to one or more random number signals.

The one or more random number signals may include, for example, a first random number signal PRNG1 and a second random number signal PRNG2.

The DAC unit array 600 may be configured to covert the mixed signal group OUT4<0:63> into a plurality of preliminary analog signals OUT5<0:63>.

The addition unit 700 may be configured to add the plurality of preliminary analog signals OUT5<0:63> and output the added signal as an analog signal Y.

The signal combination circuit 101 may include a first decoding block 300, a second decoding block 301, a first network block 400, a second network block 401, and a selection block 500.

The signal combination circuit 101 may further include a bit exchange unit 200, a first random number generation unit 800, and a second random number generation unit 801.

The first random number generation unit 800 may be configured to generate the first random number signal PRNG1.

The second random number generation unit 801 may be configured to generate the second random number signal PRNG2.

The bit exchange unit 200 may be configured to ranks of signal bits of the digital input signal X<0:5> and generate a first signal group OUT1A<0:2> and a second signal group OUT1B<0:2> according to the first random number signal PRNG1.

The first decoding block 300 may be configured to decode the first signal group OUT1A<0:2> and generate a first decoding signal group OUT2A<0:7> according to the first random number signal PRNG1.

The second decoding block 301 may be configured to decode the second signal group OUT1B<0:2> and generate a second decoding signal group OUT2B<0:7> according to the first random number signal PRNG1.

The first network block 400 may be configured to randomly mix the first decoding signal group OUT2A<0:7>. The first network block 400 may also be configured to generate the first preliminary mixed signal group OUT3A<0:7> in response to the second random number signal PRNG2.

The second network block 401 may be configured to randomly mix the second decoding signal group OUT2B<0:7>. The second network block 401 may also be configured to generate the second preliminary mixed signal group OUT3B<0:7> in response to the second random number signal PRNG2.

The selection block 500 may be configured to selectively combine the first preliminary mixed signal group OUT3A<0:7> and the second preliminary mixed signal group OUT3B<0:7> and generate the mixed signal group OUT4<0:63> according to the first random number signal PRNG1.

Figure 2:
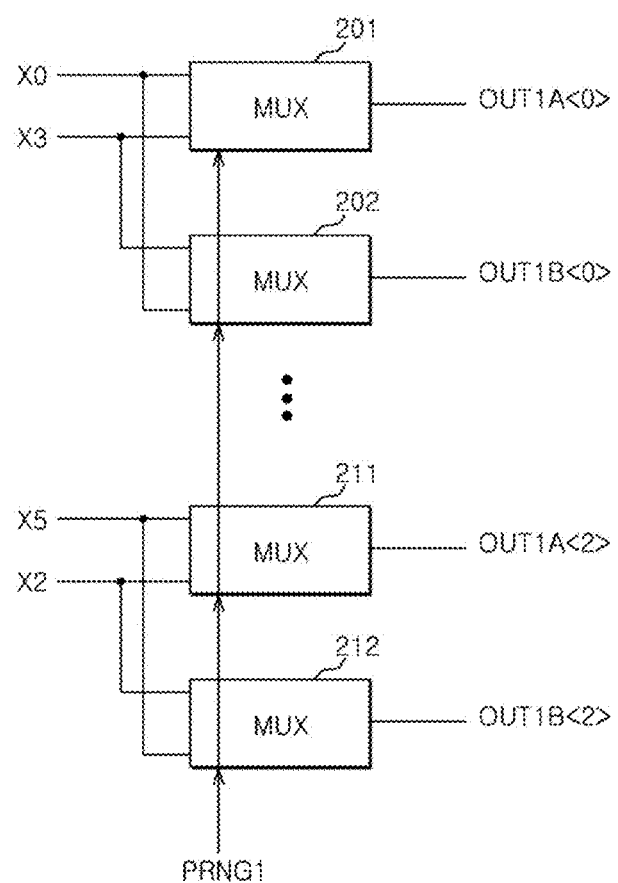
FIG. 2 is a view illustrating a configuration of a bit exchange unit of FIG. 1.

Referring to FIG. 2, the bit exchange unit 200 may include a plurality of multiplexers 201 to 212.

TABLE 1

| PRNG1 | 0 | 1 |
|---|---|---|
| OUT1A<0:2><br>OUT2A<0:7><br>OUT3A<0:7> | MSB to MSB − 2 of<br>X<0:5><br>(hereinafter, referred<br>to as MSBG) | LSB to LSB + 2 of<br>X<0:5> (hereinafter,<br>referred to as LSBG) |
| OUT1B<0:2><br>OUT2B<0:7><br>OUT3B<0:7> | LSBG | MSBG |

Among the signal bits of the input signal X<0:5>, most significant bit (MSB) to MSB−2, for example, X<5:3> is called an upper signal group (hereinafter, referred to as MSBG), and least significant bit (LSB) to LSB+2, for example, X<0:2> is called a lower signal group (hereinafter, referred to as LSBG).

The bit exchange unit 200 may select MSBG or LSBG and generate the first signal group OUT1A<0:2> and the second signal group OUT1B<0:2> according to the first random number signal PRNG1.

Referring to Table 1, when the first random number signal PRNG1 is '0 (zero),' the bit exchange unit 200 may output MSBG as the first signal group OUT1A<0:2>, and output LSBG as the second signal group OUT1B<0:2>.

When the first random number signal PRNG1 is '0 (zero),' the first signal group OUT1A<0:2>, the first decoding signal group OUT2A<0:7>, and the first preliminary mixed signal group OUT3A<0:7> may be generated based on MSBG.

When the first random number signal PRNG1 is '0,' the second signal group OUT1B<0:2>, the second decoding signal group OUT2B<0:7>, and the second preliminary mixed signal group OUT3B<0:7> may be generated based on LSBG.

However, when the first random number signal PRNG1 is '1,' the bit exchange unit 200 may output LSBG as the first signal group OUT1A<0:2>. Further, the bit exchange unit 200 may output MSBG as the second signal group OUT1B<0:2>.

When the first random number signal PRNG1 is '1,' the first signal group OUT1A<0:2>, the first decoding signal group OUT2A<0:7>, and the first preliminary mixed signal group OUT3A<0:7> may be generated based on LSBG.

When the first random number signal PRNG1 is '1,' the second signal group OUT1B<0:2>, the second decoding signal group OUT2B<0:7>, and the second preliminary mixed signal group OUT3B<0:7> may be generated based on MSBG.

The plurality of multiplexers 201 to 212 may select one signal of MSBG and one signal of LSBG and generate the first signal group OUT1A<0:2> and the second signal group OUT1B<0:2> according to the first random number signal PRNG1.

Total 12 multiplexers may be necessary since one signal of MSBG and one signal of LSBG share two multiplexers with respect to the 6 bit input signal X<0:5>.

For example, the multiplexer 201 may select one of one signal X0 from LSBG and one signal X3 from MSBG according to the first random number signal PRNG 1. The multiplexer 201 may also generate OUT1A<0> among the first signal group OUT1A<0:2>.

The multiplexer 202 may select one of the signal X3 and the signal X0 according to the first random number signal PRNG 1. The multiplexer 202 may also generate OUT1B<0> among the second signal group OUT1B<0:2>.

The multiplexer 211 may select one of one signal X2 from LSBG and one signal X5 from MSBG according to the first random number signal PRNG 1. The multiplexer 211 may also generate OUT1A<2> among the first signal group OUT1A<0:2>.

The multiplexer 212 may select one of the signal X5 and the signal X2 according to the first random number signal PRNG 1. The multiplexer 212 may also generate OUT1B<2> among the second signal group OUT1B<0:2>

Figure 3:
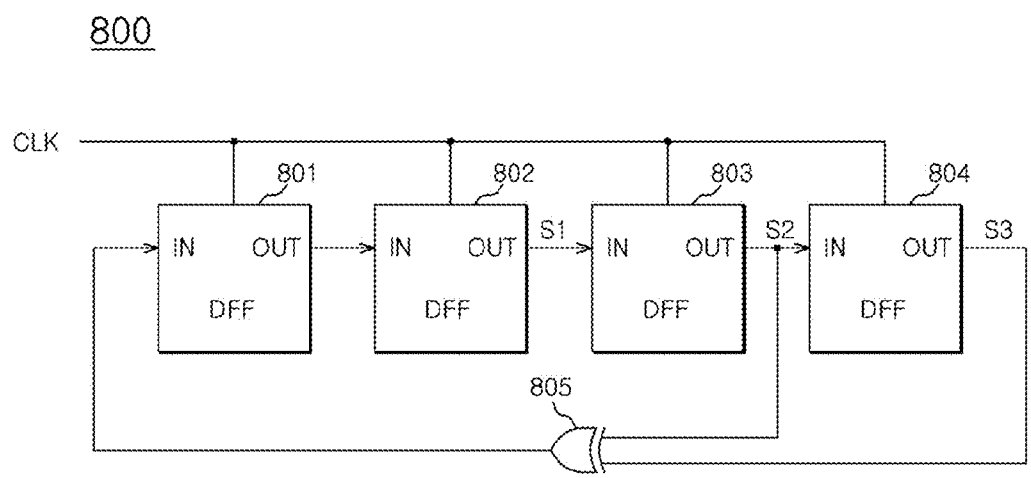
FIG. 3 is a view illustrating a configuration of a first random number generation unit of FIG. 1.

Referring to FIG. 3, the first random number generation unit 800 may be configured of a linear feedback shift register (LFSR).

The first random number generation unit 800 may include first to fourth flip flops 801 to 804 and a logic gate 805.

The logic gate 805 may perform an EX-OR logic operation on internal output signals S2 and S3 and output a logic operation result.

The first flip flop 801 may latch an output signal of the logic gate 805 and generate an output signal according to a clock signal CLK.

The second flip flop 802 may latch the output signal of the first flip flop 801 and generate an internal output signal S1 according to the clock signal CLK.

The third flip flop 803 may latch the internal output signal S1 of the second flip flop 802 and generate the internal output signal S2 according to the clock signal CLK.

The fourth flip flop 804 may latch the internal output signal S2 of the third flip flop 803 and generate the internal output signal S3 according to the clock signal CLK.

The internal output signals S1 to S3 of the first random number generation unit 800 are random numbers having no fixed rule. Therefore, any one among the internal output signals S1 to S3 may be used as the first random number signal PRNG1.

The second random number generation unit 801 may have the same configuration as that of the first random number generation unit 800.

Since the second random number generation unit 801 has the same configuration as that of the first random number generation unit 800, internal output signals S1 to S3 of the second random number generation unit 801 are random numbers having no fixed rule.

Therefore, the internal output signals S1 to S3 may be used as the second random number signal PRNG2.

Figure 4:
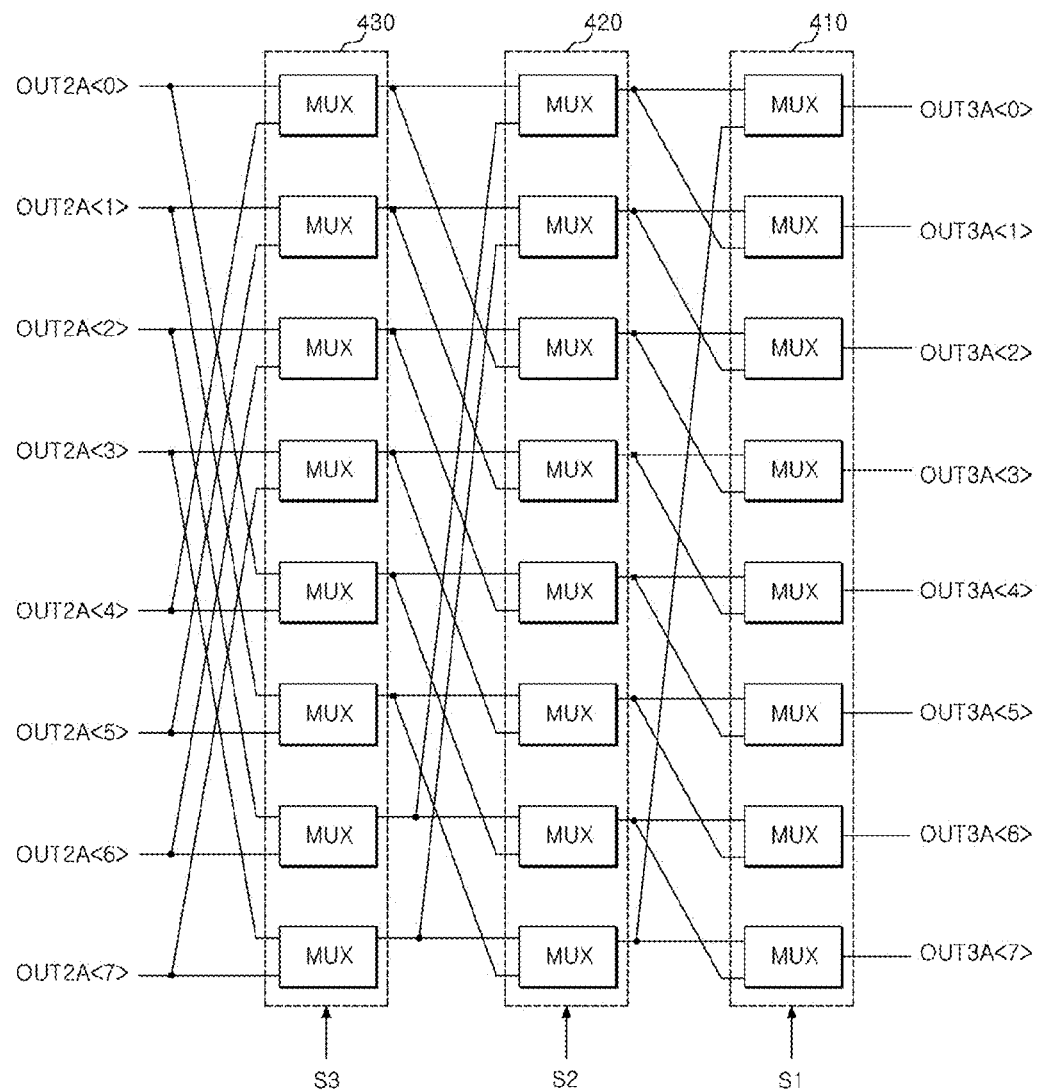
FIG. 4 is a view illustrating a configuration of a first network block of FIG. 1.

Referring to FIG. 4, the first network block 400 may include a first network stage 410, a second network stage 420, and a third network stage 430.

Each of the first to third network stages 410 to 430 may include a plurality of multiplexers.

The multiplexers of the first network stage 410 may randomly mix the first decoding signal group OUT2A<0:7> and output randomly mixed results according to S1 among signal bits of the second random number signal PRNG2.

The multiplexers of the second network stage 420 may randomly mix output signals of the first network stage 410. The multiplexers of the second network stage 420 may also output randomly mixed results according to S2 among the signal bits of the second random number signal PRNG2.

The multiplexers of the third network stage 430 may randomly mix output signals of the second network stage 420 and output randomly mixed results as the first preliminary mixed signal group OUT3A<0:7> according to S3 among the signal bits of the second random number signal PRNG2.

The second network block 401 may have the same configuration as that of the first network block 400.

Figure 5:
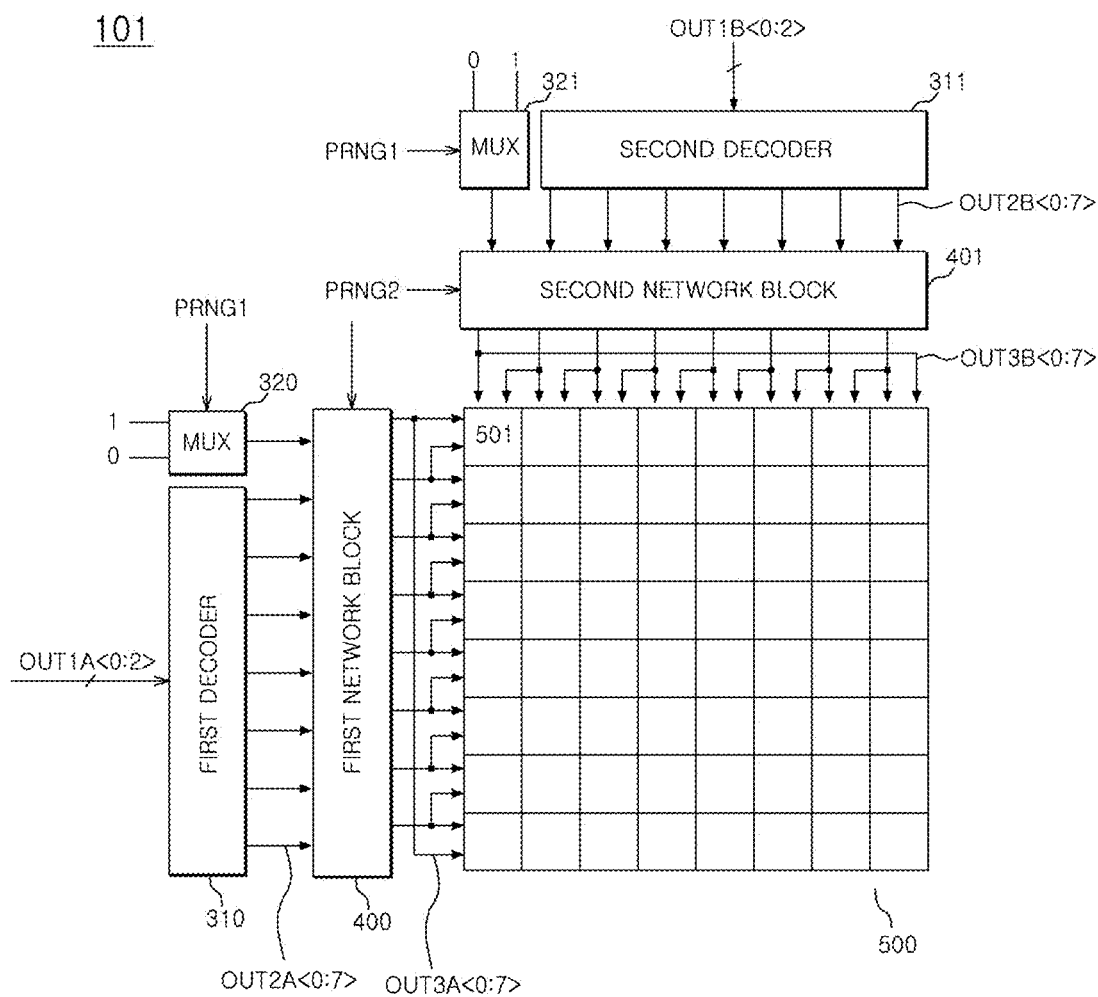
FIG. 5 is a view illustrating a configuration of a signal combination circuit according to an embodiment of the inventive concept.

Referring to FIG. 5, the signal combination circuit 101 may include the first decoding block 300, the second decoding block 301, the first network block 400, the second network block 401, and the selection block 500.

The first decoding block 300 may include a first decoder 310 and a first multiplexer 320.

The first decoder 310 may decode the first signal group OUT1A<0:2>. The first decoder 310 may also generate remaining signal bits among the first decoding signal group OUT2A<0:7> other than one signal bit.

The first multiplexer 320 may output a logic high level signal or a logic low level signal as the one signal bit among the first decoding signal group OUT2A<0:7> according to the first random number signal PRNG1.

The second decoding block 301 may include a second decoder 311 and a second multiplexer 321.

The second decoder 311 may decode the second signal group OUT1B<0:2>. The second decoder 311 may also generate remaining signal bits among the second decoding signal group OUT2B<0:7> other than one signal bit.

The second multiplexer 321 may output a logic high level signal or a logic low level signal as the one signal bit among the second decoding signal group OUT2B<0:7> according to the first random number signal PRNG1.

The selection block 500 may include a plurality of selection units 501 to 564 configured to selectively combine the first preliminary mixed signal group OUT3A<0:7> to a row direction and the second preliminary mixed signal group OUT3B<0:7> to a column direction according to the first random number signal PRNG1.

Each of the plurality of selection units 501 to 564 may selectively combine signals input to be matched with coordinates based on rows and columns and generate one signal bit of the mixed signal group OUT4<0:63>.

Each of the plurality of selection units 501 to 564 may combine any one signal and next-ranked signal of signals in the first preliminary mixed signal group OUT3A<0:7> and any one signal and next-ranked signal of signals in the second preliminary mixed signal group OUT3B<0:7>. Each of the plurality of selection units 501 to 564 may generate one signal bit of the mixed signal group OUT4<0:63> according to the first random number signal PRNG1.

Figure 6:
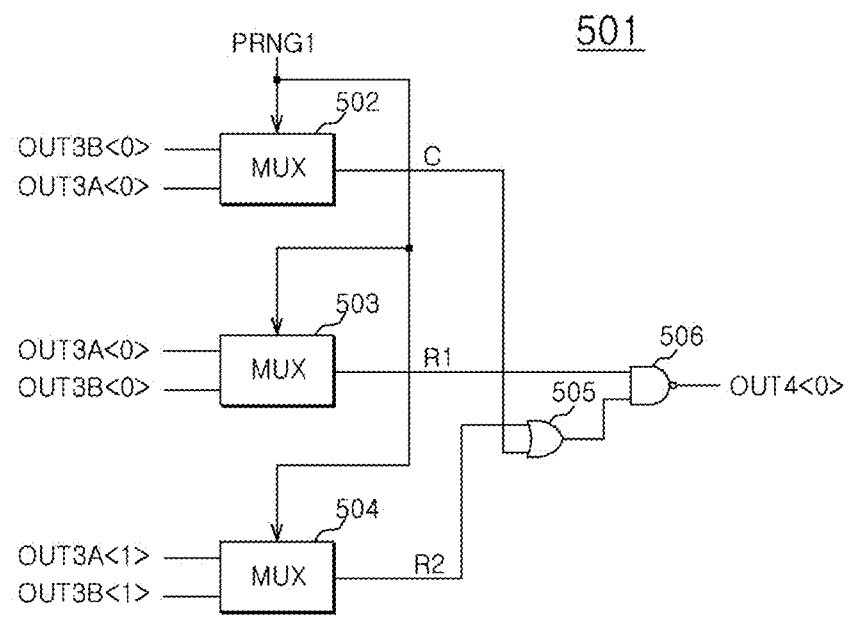
FIG. 6 is a view illustrating a configuration of a selection unit of FIG. 5.
Figure 7C:
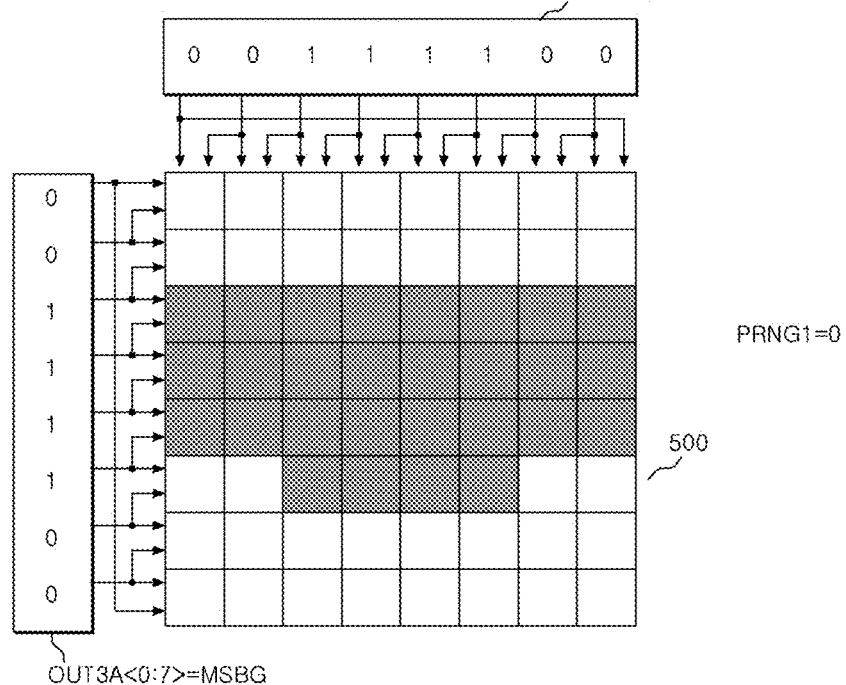
FIGS. 7A to 8D are views illustrating output distribution change of a signal combination circuit according to an embodiment of the inventive concept.
Figure 7D:
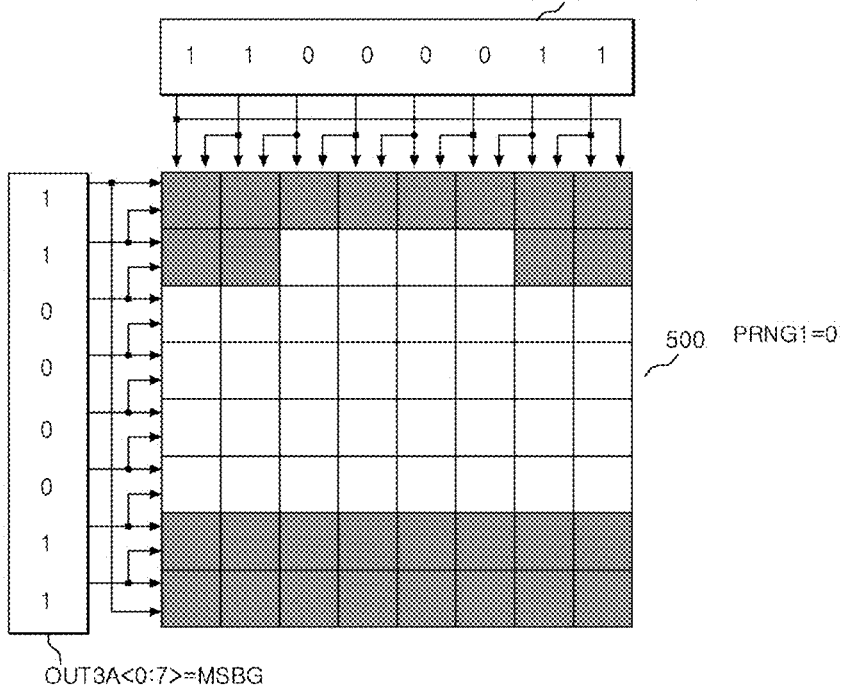

Referring to FIG. 6, the selection unit 501 may include first to third multiplexers 502 to 504, a first logic gate 505, and a second logic gate 506.

The first multiplexer 502 may select one of OUT3B<0> and OUT3A<0> and output the selected one as a first preliminary signal C according to the first random number signal PRNG1.

The second multiplexer 503 may select one of OUT3A<0> and OUT3B<0> and output the selected one as a second preliminary signal R1 according to the first random number signal PRNG1.

The third multiplexer 504 may select one of OUT3A<1> and OUT3B<1> and output the selected one as an output signal R2 (a third preliminary signal R2) according to the first random number signal PRNG1.

The first logic gate 505 may perform a logic OR operation on the first preliminary signal C and the third preliminary signal R2. The first logic gate 505 may also output a logic operation result.

The second logic gate 506 may perform a logic NAND operation on an output signal of the first logic gate 505 and the second preliminary signal R1. The second logic gate 506 may also output a logic operation result as OUT4<0> of the signal bits in the mixed signal group OUT4<0:63>.

As described above with reference to Table 1, when the first random number signal PRNG1 is '0,' OUT3B<0> may correspond to LSBG. Further, OUT3A<0> may correspond to MSBG.

The first to third multiplexers 502 to 504 may be controlled according to the first random number signal PRNG1 so that a signal corresponding to LSBG may be selected as the first preliminary signal C. In addition, any one signal and next-ranked signal may be selected from among signals corresponding to MSBG as the second preliminary signal R1 and the third preliminary signal R2.

For example, when the first random number signal PRNG1 is '0,' the first preliminary signal C may be OUT3B<0> corresponding to LSBG. Further, the second preliminary signal R1 and the third preliminary signal R2 may be OUT3A<0> and OUT3A<1> corresponding to MSBG.

When the first random number signal PRNG1 is '1,' the first preliminary signal C may be OUT3A<0> corresponding to LSBG. Moreover, the second preliminary signal R1 and the third preliminary signal R2 may be OUT3B<0> and OUT3B<1> corresponding to MSBG.

Referring to FIGS. 7A to 8D, values of the mixed signal group OUT4<0:63> may have various distributions according to change in values of the first preliminary mixed signal group OUT3A<0:7> and the second preliminary mixed signal group OUT3B<0:7> based on change of the first random number signal PRNG1 and change of the second random number signal PRNG2.

The linearity characteristic of the analog signal Y output from the DAC circuit 100 of FIG. 1 may be improved as the values of the mixed signal group OUT4<0:63> have the various distributions.

Outputs of shaded selection units among the selection units of the selection unit 500 may have a value of '0.' Further, outputs of the remaining selection units may have a value of '1.'

FIGS. 7A to 7D are illustrate distribution change of the mixed signal group OUT4<0:63> according to change in values of the first preliminary mixed signal group OUT3A<0:7> and the second preliminary mixed signal group OUT3B<0:7> when the first random number signal PRNG is '0.'

In FIG. 7A, for example, outputs of selection units corresponding to coordinates (4, 4) and (4, 5) on the basis of a row and a column will be described with reference to FIG. 6.

First, in the coordinates (4, 4), since the first random number signal PRNG1 is '0,' the first preliminary signal C may be '1' corresponding to LSBG. In addition, the second preliminary signal R1 and the third preliminary signal R2 may be '1' and '0' corresponding to MSBG.

Since C=1, R=1, and R=0, the output of the second logic gate 506 may be '0.'

Next, in the coordinates (4, 5), since the first random number signal PRNG1 is '0,' the first preliminary signal C may be '0' corresponding to LSBG, and the second preliminary signal R1 and the third preliminary signal R2 may be '1' and '0' corresponding to MSBG.

Since C=0, R=1, and R=0, the output of the second logic gate 506 may be '1.'

FIGS. 8A to 8D illustrate a distribution change of the mixed signal group OUT4<0:63> according to a change in values of the first preliminary mixed signal group OUT3A<0:7> and the second preliminary mixed signal group OUT3B<0:7> when the first random number signal PRNG is '1.'

Figure 8A:
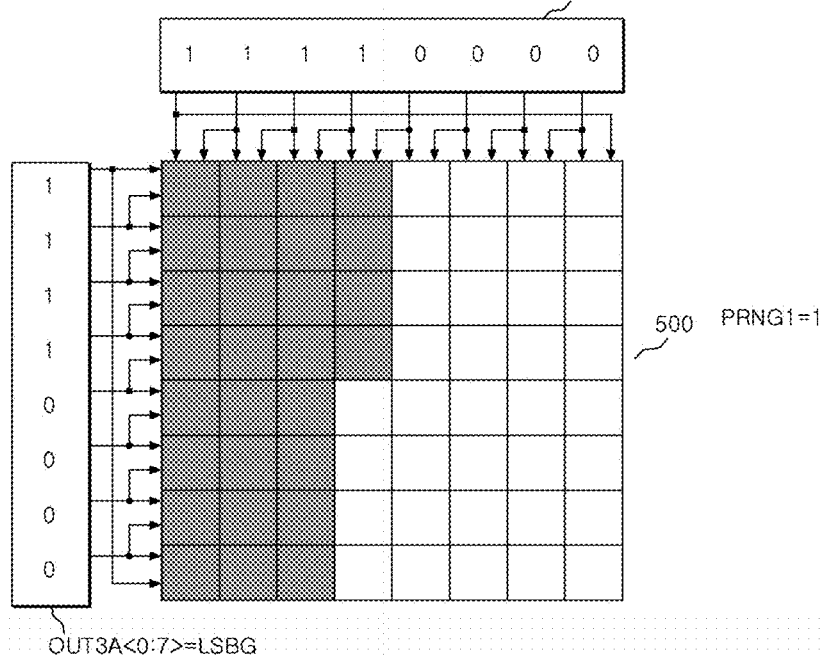
Figure 8B:
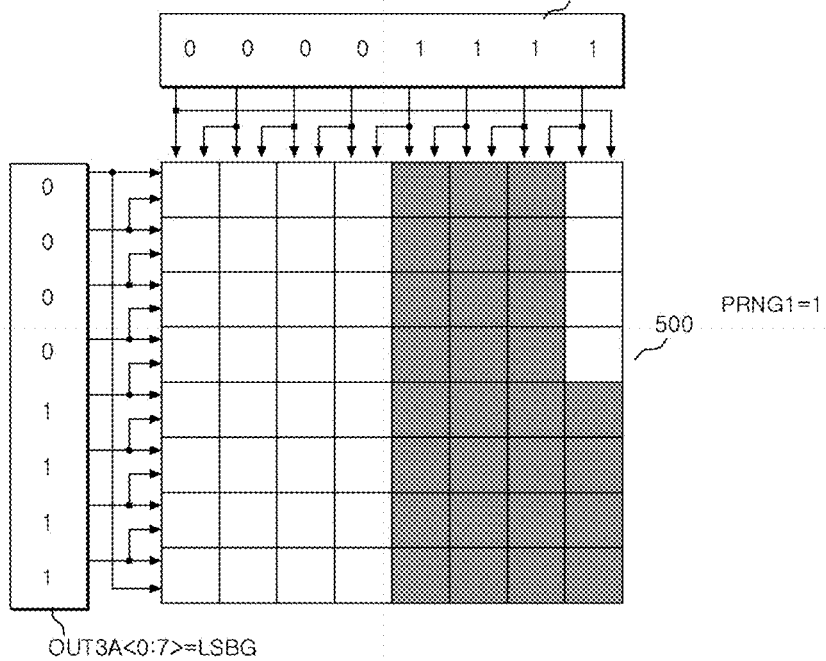
Figure 8C:
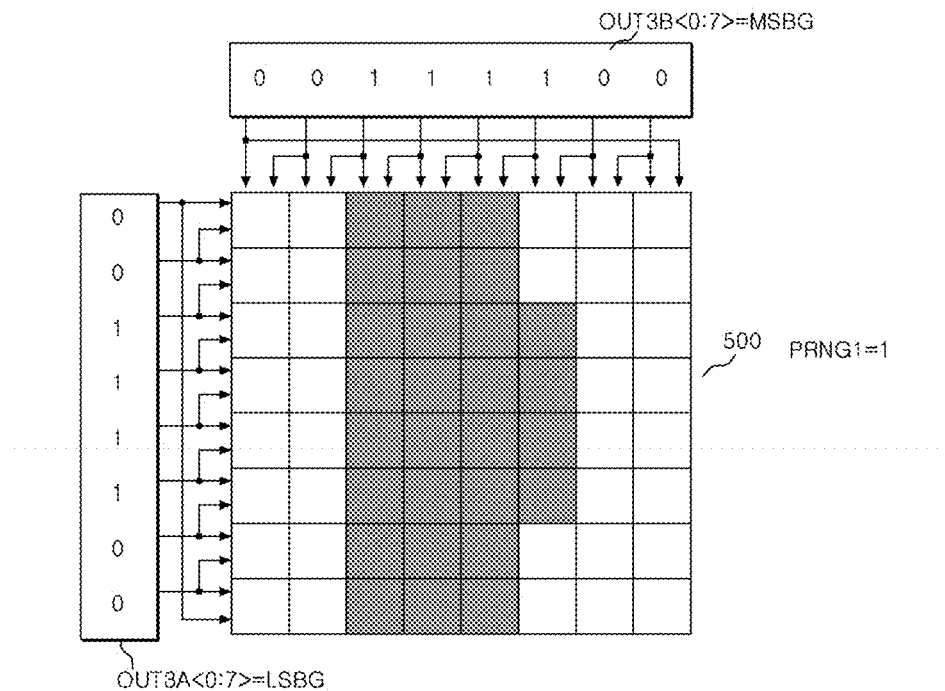
Figure 8D:
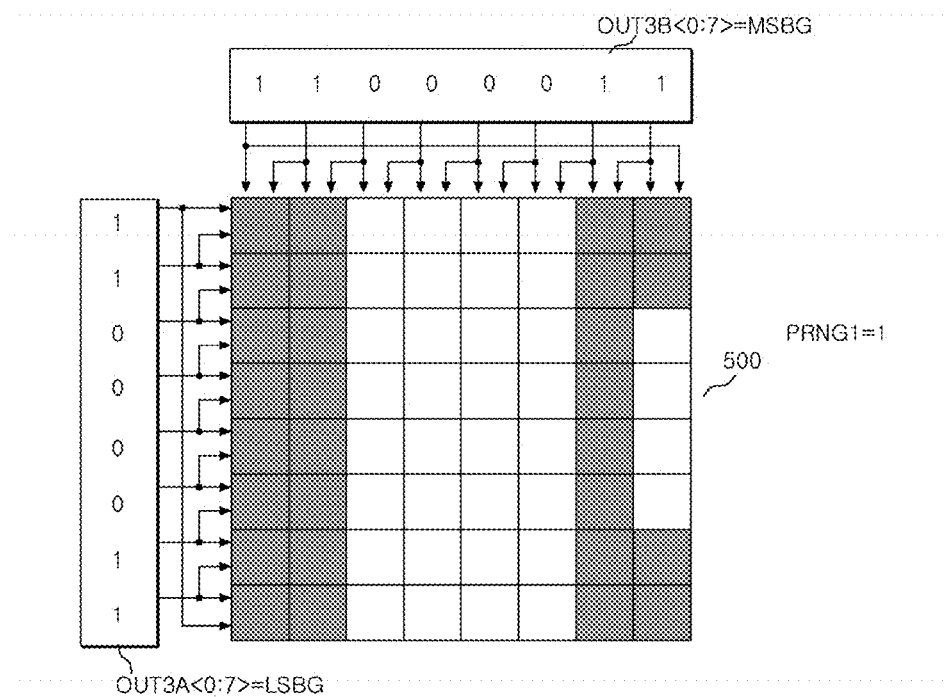

In FIG. 8A, for example, outputs of selection units corresponding to coordinates (5, 3) and (5, 4) on the basis of a row and a column will be described with reference to FIG. 6.

First, in the coordinates (5, 3), since the first random number signal PRNG1 is '1,' the first preliminary signal C may be '0' corresponding to LSBG. Further, the second preliminary signal R1 and the third preliminary signal R2 may be '1' and '1' corresponding to MSBG.

Since C=0, R=1, and R=1, the output of the second logic gate 506 may be '0.'

Next, in the coordinate (5, 4), since the first random number signal PRNG1 is '1,' the first preliminary signal C may be '0' corresponding to LSBG. In addition, the second preliminary signal R1 and the third preliminary signal R2 may be '1' and '0' corresponding to MSBG.

Since C=1, R=1, and R=0, the output of the second logic gate 506 may be '1.'

Figure 9:
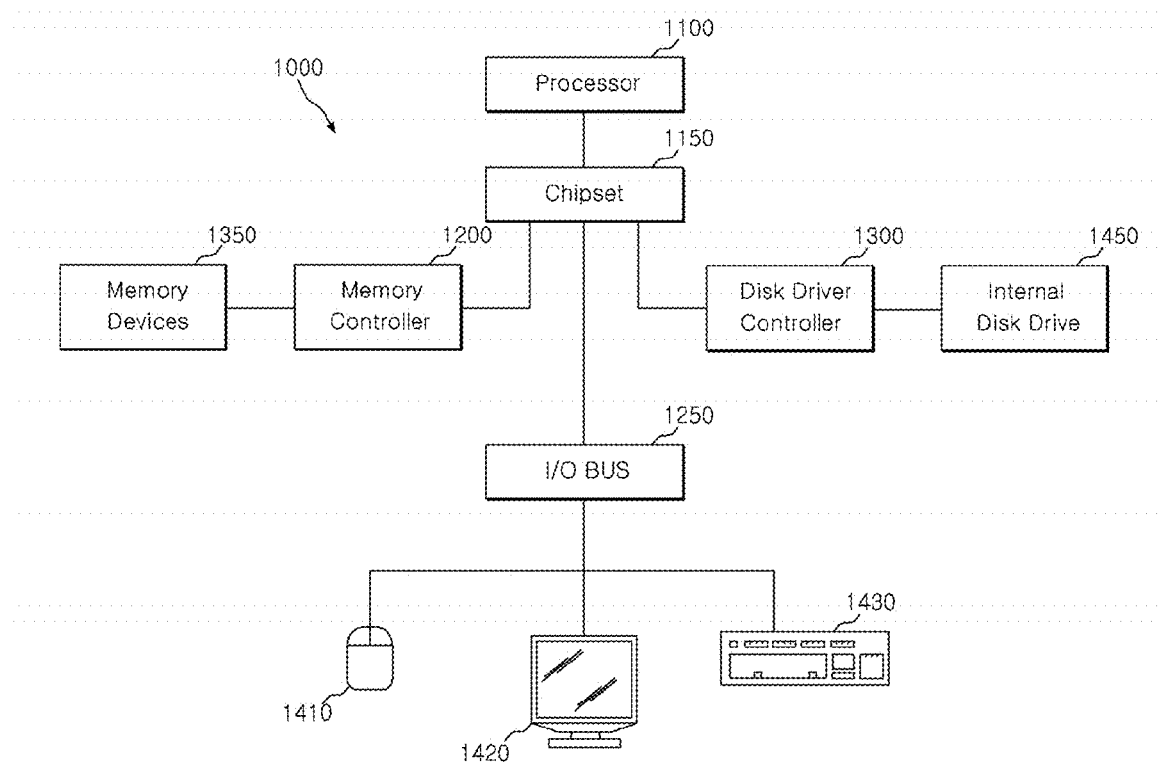
FIG. 9 illustrates a block diagram of a system employing a memory controller circuit in accordance with an embodiment of the invention.

Referring to FIG. 9, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the DAC circuit described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420 or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

The above embodiment of the invention is illustrative and not limitative. Various alternatives and equivalents are possible. The invention is not limited by the embodiment described herein. Nor is the invention limited to any specific type of semiconductor device. Other additions, subtractions, or modifications are obvious in view of the invention and are intended to fall within the scope of the appended claims.

What is claimed is:

1. A signal combination circuit comprising:
   a first decoding block configured to decode a first signal group of an input signal and generate a first decoding signal group according to a first random number signal;
   a second decoding block configured to decode a second signal group of the input signal and generate a second decoding signal group according to the first random number signal;
   a first network block configured to randomly mix the first decoding signal group and generate a first preliminary mixed signal group according to a second random number signal;
   a second network block configured to randomly mix the second decoding signal group and generate a second preliminary mixed signal group according to the second random number signal; and
   a selection block configured to selectively combine the first preliminary mixed signal group and the second preliminary mixed signal group and generate a mixed signal group according to the first random number signal.

2. The signal combination circuit of claim 1, further comprising:
   a bit exchange unit configured to change ranks of signal bits of the input signal and generate the first signal group and the second signal group in response to the first random number signal.

3. The signal combination circuit of claim 2, wherein the bit exchange unit includes a plurality of multiplexers each configured to select one signal from a higher-ranked group and a lower-ranked group of the input signal according to the first random number signal.

4. The signal combination circuit of claim 1, further comprising:
   a first random number generation unit configured to generate the first random number signal; and
   a second random number generation unit configured to generate the second random number signal.

5. The signal combination circuit of claim 1, wherein the first decoding block includes:
   a decoder configured to decode the first signal group and generate partial signal bits of the first decoding signal group; and
   a multiplexer configured to output a logic high level signal or a logic low level signal as a remaining signal bit of the first decoding signal group according to the first random number signal.

6. The signal combination circuit of claim 1, wherein the second decoding block includes:
   a decoder configured to decode the second signal group and generate partial signal bits of the second decoding signal group; and
   a multiplexer configured to output a logic high level signal or a logic low level signal as a remaining signal bit of the second decoding signal group according to the first random number signal.

7. The signal combination circuit of claim 1, wherein the selection block includes a plurality of selection units configured to selectively combine one of the first preliminary mixed signal group and the second preliminary mixed signal group to a row direction and to a column direction in response to the first random number signal.

8. The signal combination circuit of claim 7, wherein one of the selection units is configured to combine a first signal of signals in the first preliminary mixed signal group, a signal corresponding to a previous rank or next rank among the signals in the first preliminary mixed signal group, a first signal of signals in the second preliminary mixed signal group, and a signal corresponding to a previous rank or next rank among the signals in the second preliminary mixed signal group.

9. A digital to analog conversion (DAC) circuit comprising:
   a signal combination circuit configured to decode and randomly mix an input signal and generate preliminary mixed signal groups through separated signal processing paths, and to selectively combine the preliminary mixed signal groups and generate a mixed signal group according to one or more random number signals;
   a DAC unit array configured to convert the mixed signal group to a plurality of analog signals; and
   an addition unit configured to add the plurality of analog signals and output an addition result.

10. The DAC circuit of claim 9, wherein the signal combination circuit includes:
    a first decoding block configured to decode a first signal group of an input signal and generate a first decoding signal group in response to a first random number signal;
    a second decoding block configured to decode a second signal group of the input signal and generate a second decoding signal group in response to the first random number signal;
    a first network block configured to randomly mix the first decoding signal group and generate a first preliminary mixed signal group in response to a second random number signal;
    a second network block configured to randomly mix the second decoding signal group and generate a second preliminary mixed signal group in response to the second random number signal; and
    a selection block configured to selectively combine the first preliminary mixed signal group and the second preliminary mixed signal group and generate the mixed signal group in response to the first random number signal.

11. The DAC circuit of claim 10, wherein the signal combination circuit further includes a bit exchange unit configured to change ranks of signal bits of the input signal and generate the first signal group and the second signal group in response to the first random number signal.

12. The DAC circuit of claim 11, wherein the bit exchange unit includes a plurality of multiplexers each configured to select one signal from a higher-ranked group and a lower-ranked group of the input signal according to the first random number signal.

13. The DAC circuit of claim 10, wherein the signal combination unit further includes:
    a first random number generation unit configured to generate the first random number signal; and
    a second random number generation unit configured to generate the second random number signal.

14. The DAC circuit of claim 10, wherein the first decoding block includes:
    a decoder configured to decode the first signal group and generate partial signal bits of the first decoding signal group; and
    a multiplexer configured to output a logic high level signal or a logic low level signal as a remaining signal bit of the first decoding signal group according to the first random number signal.

15. The DAC circuit of claim 10, wherein the second decoding block includes:
    a decoder configured to decode the second signal group and generate partial signal bits of the second decoding signal group; and a multiplexer configured to output a logic high level signal or a logic low level signal as a remaining signal bit of the second decoding signal group according to the first random number signal.

16. The DAC circuit of claim 10, wherein the selection block includes a plurality of selection units configured to selectively combine one of the first preliminary mixed signal group and the second preliminary mixed signal group to a row direction and to a column direction in response to the first random number signal.

17. The DAC circuit of claim 16, wherein one of the selection units is configured to combine a signal of signals in the first preliminary mixed signal group, an other signal corresponding to a previous rank or next rank among the signals in the first preliminary mixed signal group, a signal of signals in the second preliminary mixed signal group, and an other signal corresponding to a previous rank or next rank among the signals in the second preliminary mixed signal group.

18. A signal combination circuit comprising:
   a bit exchange unit configured to divide signal bits of an input signal into a plurality of signal groups, and control ranks of the signal bits of the plurality of signal groups to have original values or changed values according to a first random number signal;
   a plurality of decoding blocks configured to decode the plurality of signal groups and generate a plurality of decoding signal groups according to the first random number signal;
   a plurality of network blocks configured to randomly mix the plurality of decoding signal groups and generate a plurality of preliminary mixed signal groups according to a second random number signal; and
   a selection block configured to selectively combine the plurality of preliminary mixed signal groups and generate a mixed signal group according to the first random number signal.

19. The signal combination circuit of claim 18, wherein any one of the plurality of decoding blocks includes:
   a decoder configured to decode any one of the plurality of signal groups and generate partial signal bits of one of the plurality of decoding signal groups; and
   a multiplexer configured to output a logic high level signal or a logic low level signal as a remaining signal bit of the one of the plurality of decoding signal groups according to the first random number signal.

20. The signal combination circuit of claim 18, wherein the selection block includes a plurality of selection units configured to selectively combine any one of the plurality of preliminary mixed signal groups to a row direction and to a column direction according to the first random number signal.

* * * * *